United States Patent
Li et al.

(10) Patent No.: US 8,542,039 B2
(45) Date of Patent: Sep. 24, 2013

(54) HIGH-SPEED PRE-DRIVER AND VOLTAGE LEVEL CONVERTER WITH BUILT-IN DE-EMPHASIS FOR HDMI TRANSMIT APPLICATIONS

(75) Inventors: Miao Li, San Diego, CA (US); Zhi Zhu, San Diego, CA (US); Xiaohua Kong, San Diego, CA (US); Nam V. Dang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 44 days.

(21) Appl. No.: 13/294,273

(22) Filed: Nov. 11, 2011

(65) Prior Publication Data
US 2013/0120029 A1 May 16, 2013

(51) Int. Cl.
*H03B 1/00* (2006.01)
*H03K 3/00* (2006.01)

(52) U.S. Cl.
USPC .......................................... 327/109; 327/108

(58) Field of Classification Search
USPC .................................................. 327/108, 109
See application file for complete search history.

(56) References Cited

U.S. PATENT DOCUMENTS

| | | | |
|---|---|---|---|
| 6,281,715 B1 | 8/2001 | DeClue et al. | |
| 6,300,796 B1 | 10/2001 | Troutman et al. | |
| 7,193,443 B1 | 3/2007 | Smith et al. | |
| 7,486,112 B2 | 2/2009 | Tanaka | |
| 7,659,747 B2 | 2/2010 | Shiraishi et al. | |
| 7,768,306 B2 * | 8/2010 | Chiu | 326/68 |
| 2005/0018778 A1 * | 1/2005 | Chang | 375/257 |
| 2009/0045852 A1 | 2/2009 | Agarwal | |
| 2009/0168854 A1 * | 7/2009 | Liang et al. | 375/219 |
| 2012/0057262 A1 * | 3/2012 | Yeh et al. | 361/58 |
| 2013/0082744 A1 * | 4/2013 | Zhong et al. | 327/108 |

FOREIGN PATENT DOCUMENTS

WO 2007013037 A1 2/2007

OTHER PUBLICATIONS

Adel S. Sedra and Kenneth C. Smith, Microelectronic Circuts, 2004, Oxford University Press, Fifth Edition, pp. 966-967.*
International Search Report and Written Opinion—PCT/US2012/064726—ISA/EPO—Mar. 5, 2013.

* cited by examiner

*Primary Examiner* — John Poos
(74) *Attorney, Agent, or Firm* — Sam Talpalatsky; Nicholas J. Pauley; Joseph Agusta

(57) ABSTRACT

In an example, a high-speed pre-driver and voltage level converter with built-in de-emphasis for HDMI transmit applications is provided. An exemplary integrated circuit includes a serializer, a pre-driver coupled to receive a differential input from the serializer, and a driver. The pre-driver includes all-p-type metal-oxide-silicon (PMOS) cross-coupled level converter comprising four PMOS transistors and two de-emphasis PMOS transistors forming a de-emphasis tap coupled to the output of the cross-coupled level converter. The driver is coupled to the pre-driver output and is configured to receive a differential input from the pre-driver.

24 Claims, 7 Drawing Sheets

HIGH-SPEED PRE-DRIVER AND VOLTAGE LEVEL CONVERTER WITH BUILT-IN DE-EMPHASIS FOR HDMI TRANSMIT APPLICATIONS

FIELD OF DISCLOSURE

This disclosure relates generally to electronics, and more specifically, but not exclusively, to a high-speed pre-driver and voltage level converter with built-in de-emphasis for high definition video interface (HDMI) transmit applications.

BACKGROUND

There is a market demand for transmission equipment (e.g., high definition video interface (HDMI) equipment) that converts an input between different voltage levels and that both consumes less power and has higher-bandwidth than conventional transmission equipment. An example of the transmission equipment is equipment that is high definition video interface (HDMI)-compatible. HDMI is a specification that integrates audio and video information into a single digital interface to be used with, for example, a digital video disc (DVD) player, a digital television (DTV), a high definition TV (HDTV), a set-top box, and other audio and/or video devices. The high definition multimedia interface supports standardized, enhanced, or high-definition video formats along with multi-channel surround sound audio. Some of the benefits of high definition multimedia interface may include, but are not limited to, uncompressed digital video, and a single connector instead of multiple connectors and cables.

In conventional devices, serializer outputs are high-speed, rail-to-rail signals in a 1.0V power domain. In order to drive over 10 mA of current, a driver after the serializer is conventionally a large n-type metal-oxide-silicon (NMOS) differential transistor pair. The input capacitance of the NMOS differential pair is high, which limits a bandwidth of the conventional device.

Further, since the conventional driver uses an open drain structure, a majority of the driver's current comes from a power supply having a voltage that is higher than 1.0V (e.g., 3.3V). Thus, there is a demand for a high speed, high performance circuit to convert the input from the 1.0V power domain into a power domain that is intermediate between the 1.0V power domain and the higher power domain.

Accordingly, there are long-felt industry needs for methods and apparatus that mitigate problems of conventional methods and apparatus, including a high-speed pre-driver and voltage level converter with built-in de-emphasis for HDMI transmit applications.

SUMMARY

This summary provides a basic understanding of some aspects of the present teachings. This summary is not exhaustive in detail, and is neither intended to identify all critical features, nor intended to limit the scope of the claims.

In an example, a method for changing a voltage level of an input is provided. A differential input is received from a serializer. A level of a first input of the differential input is converted to generate a first output of a pre-driver differential output signal, and a level of a second input of the differential input is converted to generate a second output of the pre-driver differential output signal. The converting the levels of the first and second inputs can include using an all-p-type metal-oxide-silicon (PMOS) cross-coupled level converter comprising four PMOS transistors. The first input of the differential input is deemphasized to generate the first output of the pre-driver differential output signal, and the second input of the differential input is deemphasized to generate the second output of the pre-driver differential output signal. The deemphasizing of the first and second inputs can be performed in parallel with the converting the levels of the first and second inputs. Further, the deemphasizing of the first and second inputs further can include using two de-emphasis PMOS transistors forming a de-emphasis tap coupled to the output of the cross-coupled level converter.

In another example, provided is an apparatus configured to pre-drive a differential input from a serializer. The apparatus includes means for receiving the differential input, means for converting a level of a first input of the differential input to generate a first output of a pre-driver differential output signal, means for converting a level of a second input of the differential input to generate a second output of the pre-driver differential output signal, means for deemphasizing the first input of the differential input to generate the first output of the pre-driver differential output signal, and means for deemphasizing the second input of the differential input to generate the second output of the pre-driver differential output signal. The means for converting the levels of the first and second inputs can include an all-p-type metal-oxide-silicon (PMOS) cross-coupled level converter comprising four PMOS transistors. Further, the means for deemphasizing the first and second inputs can further include two de-emphasis PMOS transistors forming a de-emphasis tap coupled to the output of the cross-coupled level converter. The apparatus can also include means for deemphasizing the first and second inputs in parallel with the converting the levels of the first and second inputs. In an example, the apparatus is at least partially integrated on at least one semiconductor die. The apparatus can be integrated in a semiconductor die, and can be integrated into a device, selected from the group consisting of an HDMI v1.4-compatible device, a mobile device, a set-top box, a television, a computer, a computer video card, a game console, DVD player, a satellite receiver, a monitor, a display headset, a video repeater, a video camera, a home theatre receiver, and a video switching device. In a further example, provided is a non-transitory computer-readable medium, comprising instructions stored thereon that, if executed by a lithographic device, cause the lithographic device to fabricate at least a part of the apparatus.

In a further example, provided is an integrated circuit. The apparatus includes a serializer, a pre-driver coupled to receive a differential input from the serializer, and a driver coupled to the pre-driver output and configured to receive a differential input from the pre-driver. Each input of the differential input can be coupled to a respective complementary input of the cross-coupled level converter and/or an input of a respective one of the de-emphasis PMOS transistors. The pre-driver includes an all-p-type metal-oxide-silicon (PMOS) cross-coupled level converter comprising four PMOS transistors and two de-emphasis PMOS transistors forming a de-emphasis tap coupled to the output of the cross-coupled level converter. The integrated circuit can also include a tail current control transistor coupled between the cross-coupled level converter and ground and a current mirror coupled to control the tail current control transistor. A second current mirror can be coupled to be controlled by the first current mirror and to supply current to the two de-emphasis PMOS transistors. Further, the serializer can be powered by a first power domain and the cross-coupled level converter can be powered by a second power domain. In an example, at least one of the serializer, the pre-driver, and the driver are integrated on at least one semiconductor die. The integrated circuit can be integrated with at least one of an HDMI v1.4-compatible device, a mobile device, a set-top box, a television, a computer, a computer video card, a game console, DVD player, a satellite receiver, a monitor, a display headset, a video repeater, a video camera, a home theatre receiver, and a video switching device. In a further example, provided is a non-transitory computer-readable medium, comprising instructions stored thereon that, if executed by a lithographic device, cause the lithographic device to fabricate at least a part of the integrated circuit.

In an example, a method for changing a voltage level of an input is provided. The method includes a step for receiving a differential input from a serializer, a step for converting a level of a first input of the differential input to generate a first output of a pre-driver differential output signal, and a step for converting a level of a second input of the differential input to generate a second output of the pre-driver differential output signal. Further, the method includes a step for deemphasizing the first input of the differential input to generate the first output of the pre-driver differential output signal and a step for deemphasizing the second input of the differential input to generate the second output of the pre-driver differential output signal.

The foregoing has broadly outlined some of the features and technical advantages of the present teachings in order that the detailed description can be better understood. Additional features and advantages are also described in the detailed description. The conception and disclosed embodiments can be readily utilized as a basis for modifying or designing other structures for carrying out the same purposes of the present teachings. Such equivalent constructions do not depart from the technology of the teachings as set forth in the claims. The novel features that are characteristic of the teachings, together with further objects and advantages, are better understood from the detailed description and the accompanying figures. Each of the figures is provided for the purpose of illustration and description only, and does not limit the present teachings.

BRIEF DESCRIPTION OF THE DRAWINGS

The accompanying drawings are presented to describe examples of the present teachings, and are not limiting.

Figure 1:
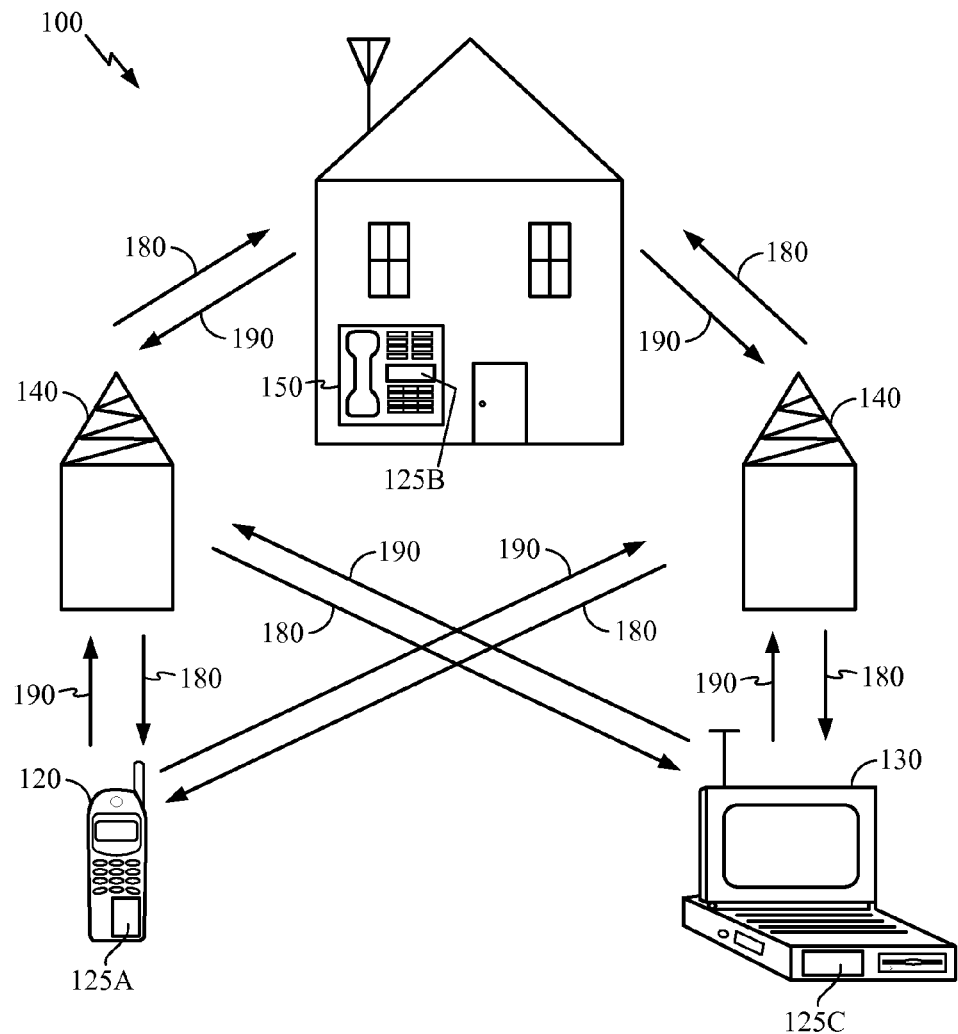
FIG. 1 depicts an exemplary communication system in which an embodiment of the disclosure may be advantageously employed.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

Introduction

A high-speed pre-driver providing voltage level conversion and de-emphasis for high definition video interface (HDMI) transmit applications is provided. In an example, an integrated circuit includes a serializer circuit, a pre-driver coupled to receive a differential input from the serializer circuit, and a driver circuit. The pre-driver includes all-p-type metal-oxide-silicon (PMOS) cross-coupled level converter comprising four PMOS transistors and two de-emphasis PMOS transistors forming a de-emphasis tap coupled to the output of the cross-coupled level converter. The driver circuit is coupled to the pre-driver output and is configured to receive a differential input from the pre-driver. The pre-driver is a low-power, high-speed circuit block that can transport data across power domains at a data rate of several Gigabits per second. The pre-driver also has a built-in de-emphasis capability to extend its bandwidth. If the pre-driver is used as pre-driver to drive an NMOS-based differential driver, the pre-driver and voltage level converter will emphasize the signal's falling edge, without reducing rising edge headroom.

The pre-driver can be integrated with HDMI transmission devices (e.g., an HDMI v1.4 compliant device transmitting at 3.4 Gb/s). The pre-driver can be integrated with a current mode logic (CML)-based driver having multiple power domains.

An advantage provided by the exemplary apparatuses and methods disclosed herein is an improvement in speed over conventional devices. Another advantage is a high drive voltage level with low power consumption (e.g., 1.5 mA without deemphasis at a typical corner). Further, advantageous falling-edge de-emphasis functionality that does not deteriorate headroom if there is a bandwidth limit at an internal node is also provided.

The pre-driver can convert an input between low-to-high voltage levels across power domains. In addition, the pre-driver can drive large n-type metal-oxide-silicon (NMOS) transistors.

Examples of the current teachings are disclosed in this application's text and drawings. The examples advantageously address the long-felt industry needs, as well as other previously unidentified needs, and mitigate shortcomings of the conventional methods and apparatus. Alternate embodiments can be devised without departing from the scope of the invention. Additionally, conventional elements of the current teachings may not be described in detail, or may be omitted, to avoid obscuring aspects of the current teachings.

The word "exemplary" is used herein to mean "serving as an example, instance, or illustration." Any embodiment described as "exemplary" is not necessarily to be construed as preferred or advantageous over other embodiments. Likewise, the term "embodiments of the invention" does not require that all embodiments of the invention include the discussed feature, advantage, or mode of operation. Use of the terms "in one example," "an example," "in one feature," and/or "a feature" in this specification does not necessarily refer to the same feature and/or example. Furthermore, a particular feature and/or structure can be combined with one or more other features and/or structures.

It should be noted that the terms "connected," "coupled," or any variant thereof, mean any connection or coupling, either direct or indirect, between two or more elements, and can encompass the presence of one or more intermediate elements between two elements that are "connected" or "coupled" together. The coupling or connection between the elements can be physical, logical, or a combination thereof.

As employed herein two elements can be considered to be "connected" or "coupled" together by the use of one or more wires, cables, and/or printed electrical connections, as well as by the use of electromagnetic energy, such as electromagnetic energy having wavelengths in the radio frequency region, the microwave region and/or the optical (both visible and invisible) region, as several non-limiting and non-exhaustive examples.

It should be understood that the term "signal" can include any signal such as a data signal, audio signal, video signal, multimedia signal. Information and signals can be represented using any of a variety of different technologies and techniques. For example, data, instructions, process step, commands, information, signals, bits, symbols, and chips that can be referenced throughout this description can be represented by voltages, currents, electromagnetic waves, magnetic fields or particles, optical fields or particles, and/or any combination thereof.

It should be understood that any reference to an element herein using a designation such as "first," "second," and so forth does not generally limit the quantity or order of those elements. Rather, these designations can be used herein as a convenient method of distinguishing between two or more elements or instances of an element. Thus, a reference to first and second elements does not mean that only two elements can be employed, or that the first element must necessarily precede the second element. Also, unless stated otherwise, a set of elements can comprise one or more elements. In addition, terminology of the form "at least one of: A, B, or C" used in the description or the claims means "A or B or C or any combination of these elements."

The terminology used herein is for the purpose of describing particular embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

In the following description, certain terminology is used to describe certain features. The term "mobile device" includes, but is not limited to, a mobile phone, a mobile communication device, personal digital assistant, mobile palm-held computer, a wireless device, and/or other types of portable electronic devices typically carried by a person and/or having some form of communication capabilities (e.g., wireless, infrared, short-range radio, etc.).

Description of the Figures

FIG. 1 depicts an exemplary communication system 100 in which an embodiment of the disclosure may be advantageously employed. For purposes of illustration, FIG. 1 shows three remote units 120, 130, and 150 and two base stations 140. It will be recognized that conventional wireless communication systems may have many more remote units and base stations. The remote units 120, 130, and 150 include at least a part of an embodiment 125A-C of the disclosure as discussed further herein. FIG. 1 shows forward link signals 180 from the base stations 140 and the remote units 120, 130, and 150, as well as reverse link signals 190 from the remote units 120, 130, and 150 to the base stations 140.

In FIG. 1, remote unit 120 is shown as a mobile telephone, remote unit 130 is shown as a portable computer, and remote unit 150 is shown as a fixed location remote unit in a wireless local loop system. For example, the remote units may be mobile phones, hand-held personal communication systems (PCS) units, portable data units such as personal data assistants, settop boxes, music players, video players, entertainment units, or any other device that stores or retrieves data or video, or any combination thereof. Although FIG. 1 illustrates remote units according to the teachings of the disclosure, the disclosure is not limited to these exemplary illustrated units. Embodiments of the disclosure may be suitably employed in any device which includes active integrated circuitry including memory and on-chip circuitry for test and characterization.

Figure 2:
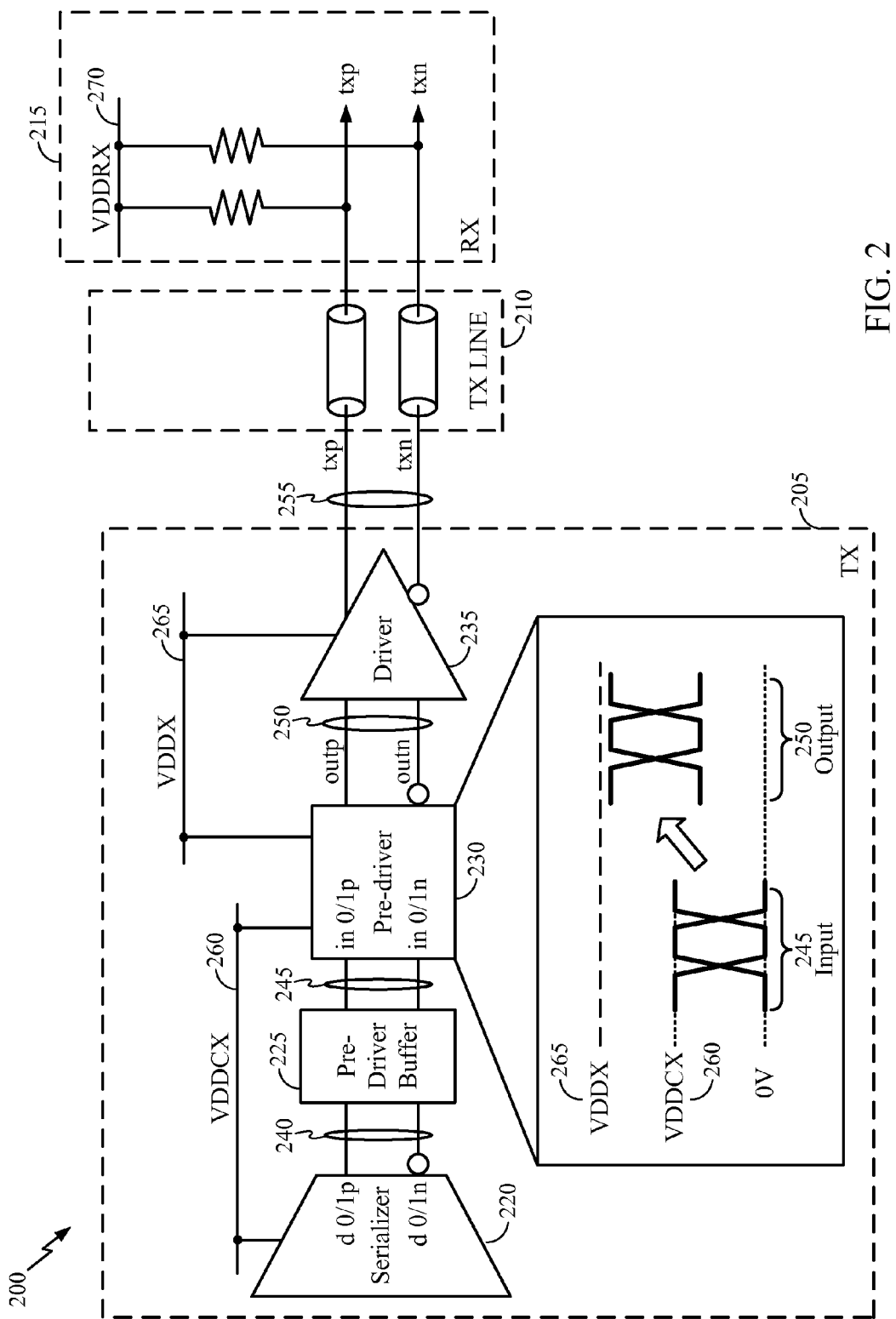
FIG. 2 depicts an exemplary block diagram of a transmitter.

FIG. 2 depicts an exemplary block diagram of a communication circuit 200. The communication circuit 200 includes a transmitter 205, a transmission line 210, and a receiver 215. The transmitter 205 includes a serializer 220, a pre-driver buffer 225, a pre-driver 230, and a driver 235. The components of the transmitter 205 can be integrated with an HDMI v1.4-compatible device, a mobile device, a set-top box, a television, a computer, a computer video card, a game console, DVD player, a satellite receiver, a monitor, a display headset, a video repeater, a video camera, a home theatre receiver, and/or a video switching device.

The serializer 220 takes N parallel bits of data at a low data rate and shifts them out serially at N times a high clock speed to the pre-driver. For example, the serializer 220 can serialize 8-bit wide parallel input data at 100 MHz to produce an output serial data stream at 800 MHz. The serializer output 240 can be a differential (d0/1p and d0/1n) output. There is a one-bit delay between in0p and in1p, and there is a one-bit delay between in0n and in1n. If one conductor of the serializer output 240 is grounded, the serializer output 240 can be a single-ended output.

The pre-driver buffer 225 receives the serializer output 240 (d0/1p and d0/1n), and provides isolation, ESD protection, and a pre-driver buffer output 245 (in0/1n and in0/1p) to the pre-driver 230.

The pre-driver 230 adapts the pre-driver buffer output 245 (in0/1n and in0/1p) to the driver input, and compensates for input characteristics of the driver 235. For example, the pre-driver 230 can convert voltage levels such as a common-mode voltage and/or a peak voltage. The pre-driver 230 can also adjust the waveform of the serializer output 240 to compensate for the input impedance of the driver 235. A pre-driver output 250 can be a differential (outp and outn) output. If one conductor of the pre-driver output 250 is grounded, the pre-driver output 250 can be a single-ended output. Examples of the pre-driver 230 are discussed herein with reference to FIG. 3 and FIG. 4.

The driver 235 amplifies an input from the pre-driver 230 and provides a driver output 255 (txp and txn) to the transmission line 210. The transmission line 210 can be an HDMI cable. The driver output 255 can be a differential (txp and txn) output. If one conductor of the driver output 255 is grounded, the driver output 255 can be a single-ended output.

The communication circuit 200 can have three different power domains. The first power domain 260 (VDDCX and VSSCX) is in the transmitter, and powers at least a portion of the serializer and at least a portion of the pre-driver. In an example, the first power domain 260 has a voltage of approximately 1.0 volts. The second power domain 265 (VDDX and VSSX) is in the transmitter, and powers at least a portion of the pre-driver 230 and at least a portion of the driver. In an example, the second power domain 265 has a voltage of approximately 1.8 volts. The third power domain 270 (VDDRX) is in the receiver 215, and provides power to the driver 235 via the transmission line 210. In an example, the third power domain 270 has a voltage of approximately 3.0 volts.

Figure 3:
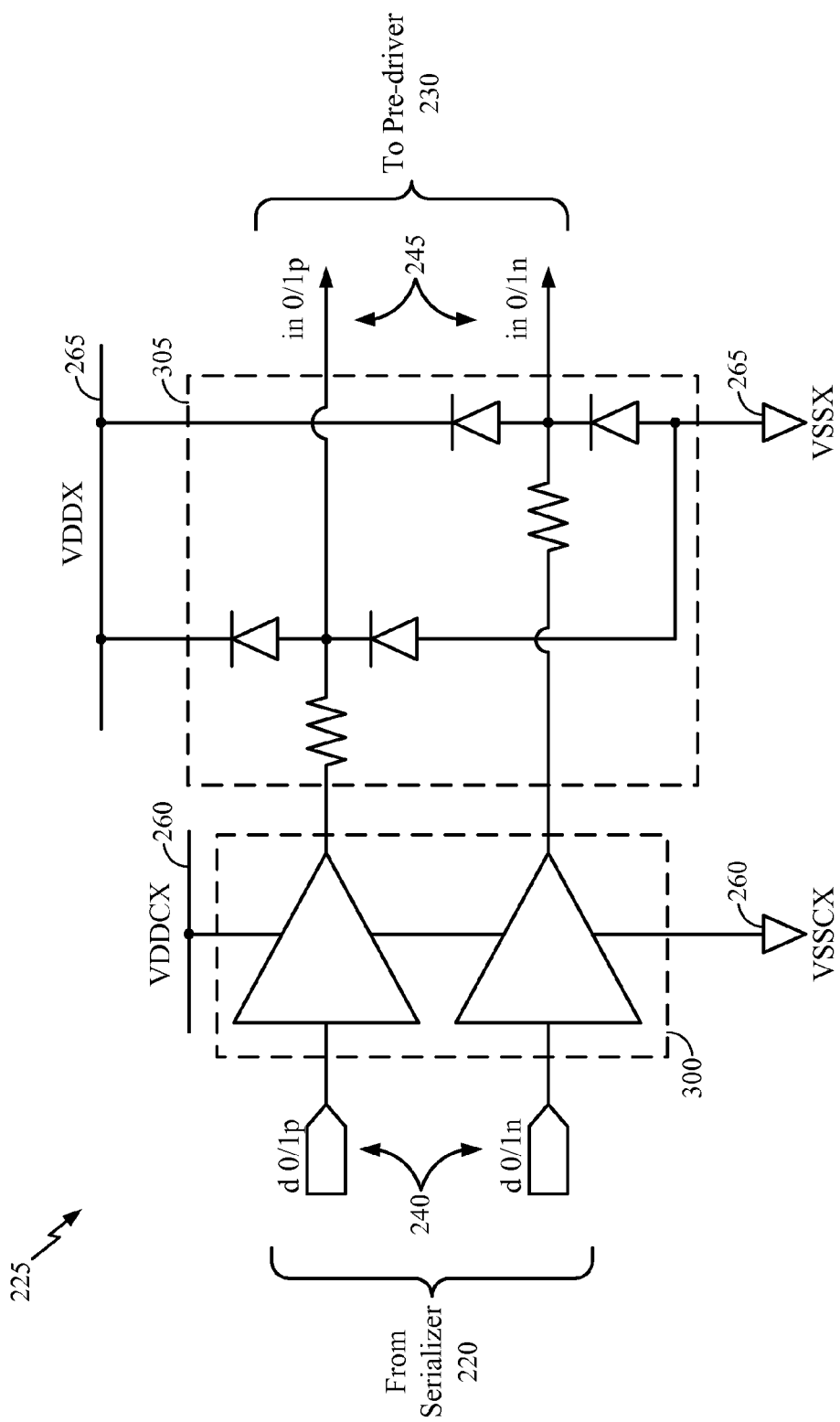
FIG. 3 depicts an exemplary pre-driver buffer.

FIG. 3 depicts an exemplary pre-driver buffer 225. Though depicted as a separate block in FIG. 2, the pre-driver buffer 225 can be a part of the pre-driver 230, in an input portion of the pre-driver 230. The pre-driver buffer 225 performs buffering of the serializer output 240 (d0/1p and d0/1n) with complementary-metal-oxide-silicon (CMOS) buffers 300 powered by the first power domain 260. The pre-driver buffer 225 also has electrostatic discharge (ESD) protection circuitry 305 that shunts high-voltage surges to the second power domain 265. The pre-driver buffer outputs 245 (in0/1n and in0/1p) are input to the pre-driver 230.

Figure 4:
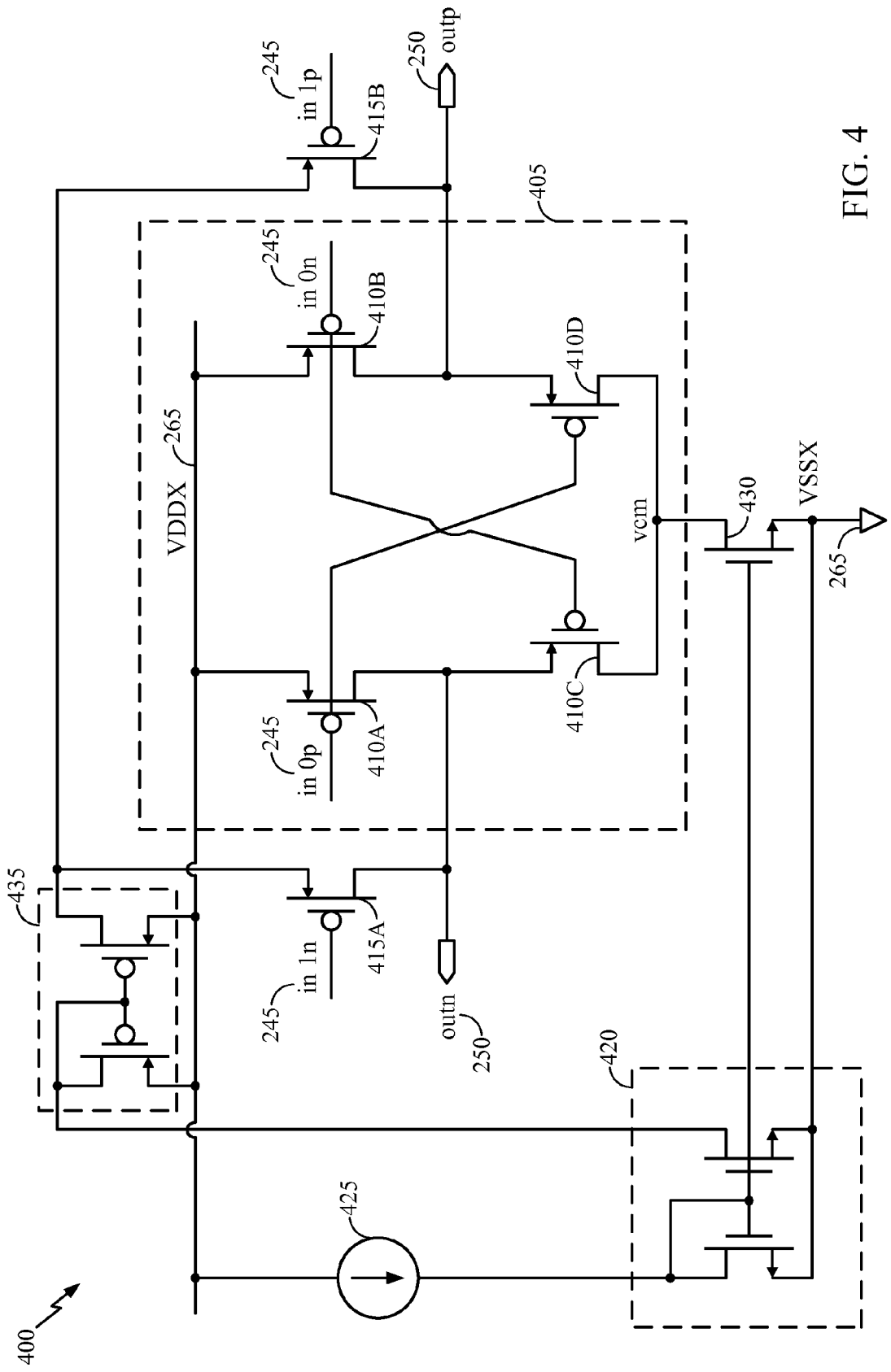
FIG. 4 depicts a first exemplary pre-driver.

FIG. 4 depicts a first pre-driver 400 that is an example of the pre-driver 230. The first pre-driver 400 is a low-power, high-speed circuit block that transports data across power domains at a data rate of several gigabits per second. The first pre-driver 400 also de-emphasized the rising and falling edges of the input pre-driver buffer outputs 245 (in0/1n and in0/1p).

The first pre-driver 400 includes a p-type metal-oxide-silicon (PMOS) cross-coupled level converter 405 comprising four PMOS transistors 410A-D. A respective complementary input of the cross-coupled level converter 405 is coupled to two of the four pre-driver buffer outputs (in0n and in0p). The output of the cross-coupled level converter 405 is the pre-driver output 250 (outp and outn). The cross-coupled level converter 405 converts voltage levels such as a common-mode voltage and/or a peak voltage. The PMOS transistors 410A-D can be sized so that the pre-driver output 250 (outp and outn) is between VDDX/2 and VDDX. The crossing point of the pre-driver output 250 (outp and outn) can be approximately (VDDX−VDDCX)/2.

The first pre-driver 400 also includes two de-emphasis PMOS transistors 415A-B forming a de-emphasis tap coupled to the output of the cross-coupled level converter 405. The de-emphasis PMOS transistors 415A-B are coupled in parallel with the cross-coupled level converter 405, are overdriven, and increase a bandwidth of the first pre-driver 400. There is a one-bit delay between in0p and in1p and there is a one-bit delay between in0n and in1n.

The de-emphasis PMOS transistors 415A-B and the cross-coupled level converter 405 are powered by the second power domain 265 (VDDX and VSSX). An NMOS current mirror 420 is controlled by a current source 425, thus providing NMOS current steering. The current source 425 and the NMOS current mirror 420 also control a tail current transistor 430 that sets a peak voltage (vcm) and crossing point of the pre-driver output 250 (outp and outn). If the crossing point is too low, intra-pair skew will occur since the driver's current source has a finite output resistance. Thus, the crossing point can be set high enough to mitigate intra-pair skew. Additionally, the NMOS current mirror 420 controls a PMOS current mirror 435 that controls current flow through the two de-emphasis PMOS transistors 415A-B.

Figure 5:
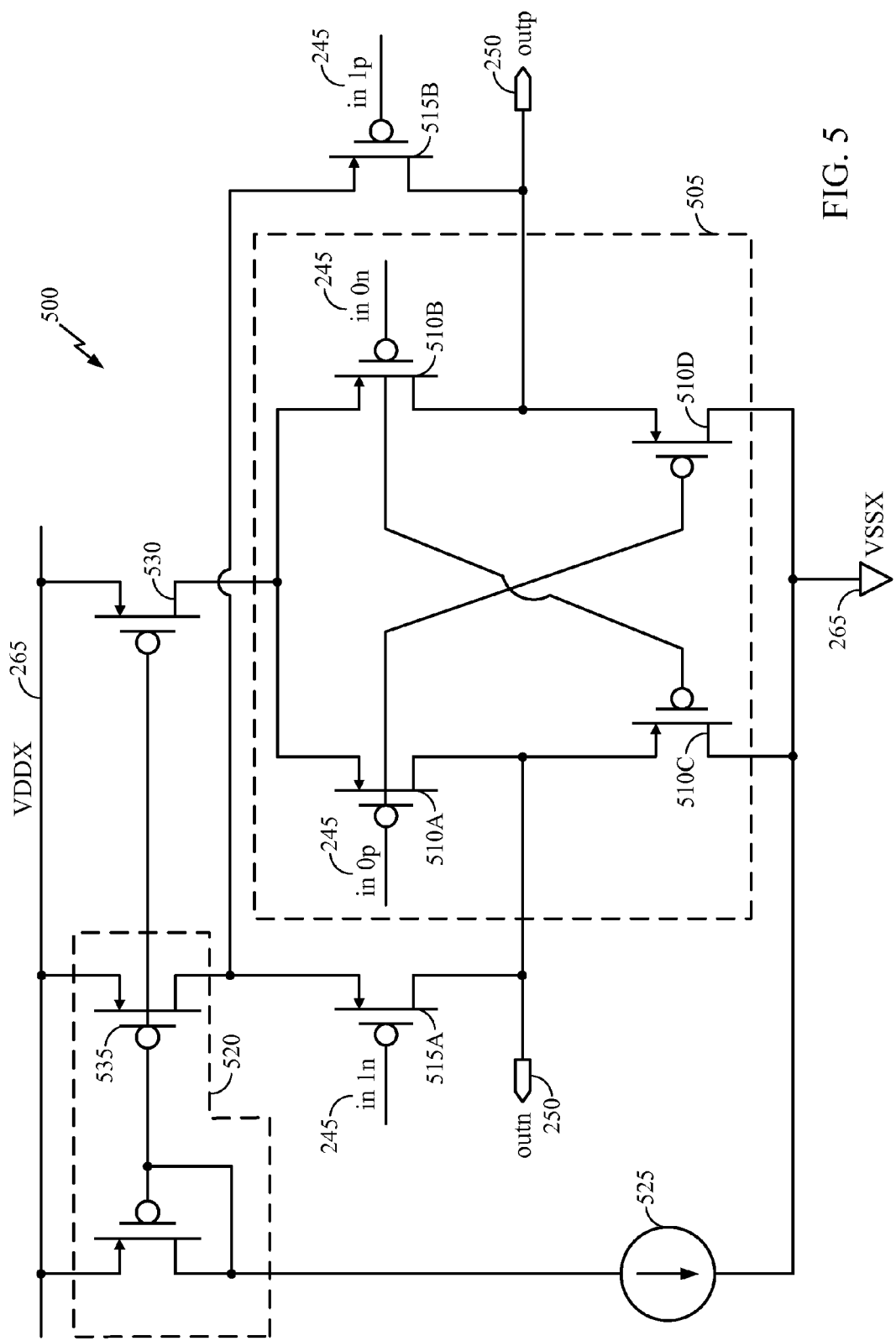
FIG. 5 depicts a second exemplary pre-driver.

FIG. 5 depicts a second pre-driver 500 that is an example of the pre-driver 230. The second pre-driver 500 is a low-power, high-speed circuit that transports data across power domains at a data rate of several gigabits per second. The second pre-driver has de-emphasis capability to extend its bandwidth. If the second pre-driver 500 is used as the pre-driver 230 to drive an NMOS-based differential driver, the second pre-driver 500 emphasizes a signal's falling edge, without reducing rising edge headroom.

The second pre-driver 500 includes a p-type metal-oxide-silicon (PMOS) cross-coupled level converter 505 comprising four PMOS transistors 510A-D. A respective complementary input of the cross-coupled level converter 505 is coupled to two of the four pre-driver buffer outputs (in0n and in0p). The output of the cross-coupled level converter is the pre-driver output 250 (outp and outn). The cross-coupled level converter 505 converts voltage levels such as a common-mode voltage and/or a peak voltage. The PMOS transistors 510A-D can be sized so that the pre-driver output 250 (outp and outn) is between voltages of VDDX/2 and VDDX. The crossing point of the pre-driver output 250 (outp and outn) can be approximately (VDDX−VDDCX)/2.

The second pre-driver 500 also includes two de-emphasis PMOS transistors 515A-B forming a de-emphasis tap coupled to the output of the cross-coupled level converter 505. The de-emphasis PMOS transistors 515A-B are coupled in parallel with the cross-coupled level converter 505, are overdriven, and increase a bandwidth of the second pre-driver 500. There is a one-bit delay between in0p and in1p and there is a one-bit delay between in0n and in1n.

The de-emphasis PMOS transistors 515A-B and the cross-coupled level converter 505 are powered by the second power domain 265 (VDDX and VSSX). A PMOS current mirror 520 is controlled by a current source 525, thus providing PMOS current steering. The current source 525 and the PMOS current mirror 520 also control a first main-tap current transistor 530 that sets a peak voltage and crossing point of the pre-driver output 250 (outp and outn). If the crossing point is too low, intra-pair skew will occur since the driver's current source has a finite output resistance. Thus, the crossing point can be set high enough to mitigate intra-pair skew. Additionally, the PMOS current mirror 520 controls a second main-tap current transistor 535 that controls current flow through the two de-emphasis PMOS transistors 515A-B. The second main-tap current transistor 535 can be sized to set a de-emphasis strength of the two de-emphasis PMOS transistors 515A-B.

Figure 6:
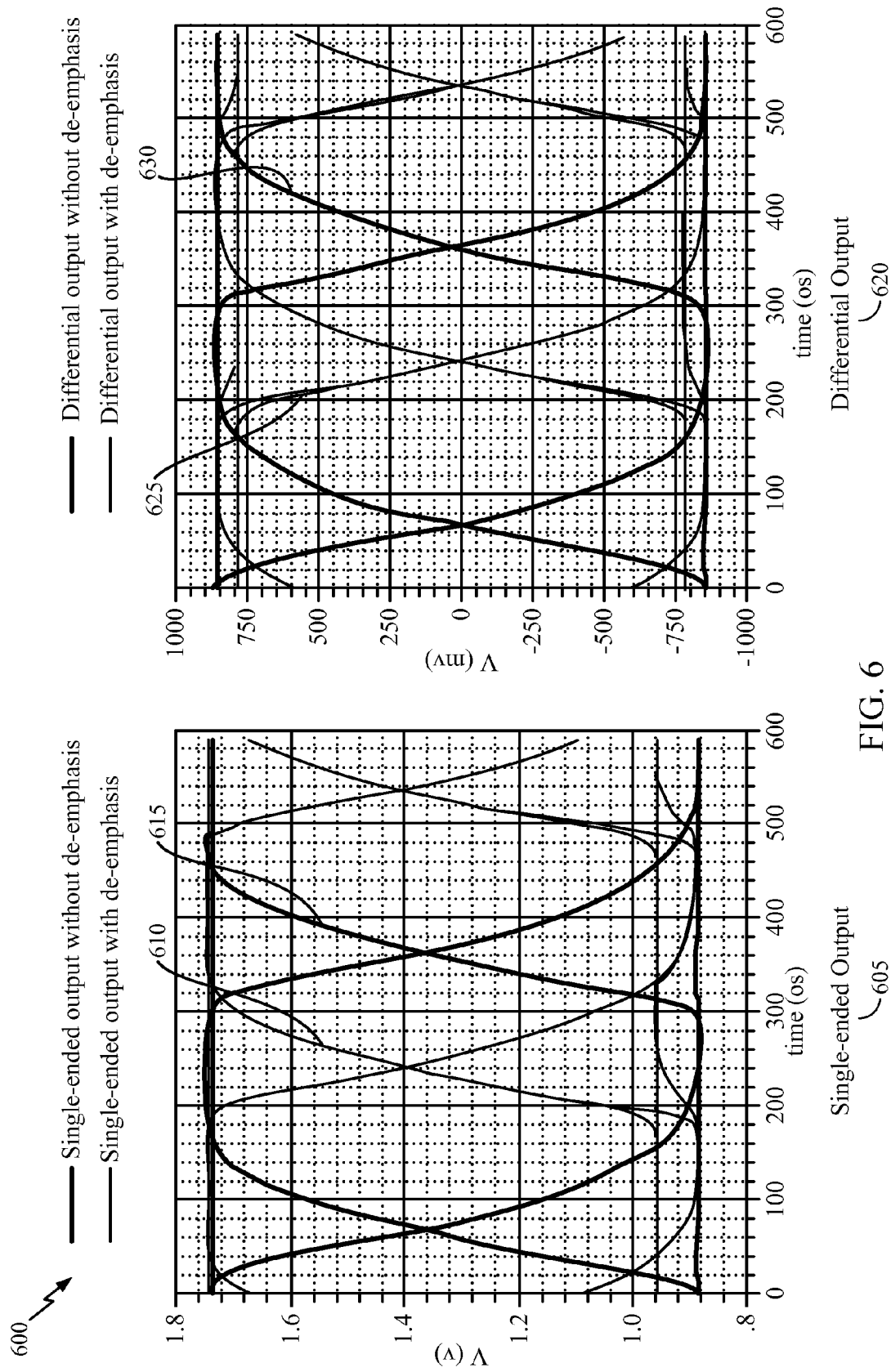
FIG. 6 depicts exemplary pre-driver outputs with de-emphasis and without de-emphasis.

FIG. 6 depicts exemplary pre-driver outputs 600, including a single-ended output 605, with de-emphasis 610 and without de-emphasis 615. The exemplary pre-driver outputs 600 also include a differential output 620, with de-emphasis 625 and without de-emphasis 630.

Figure 7:
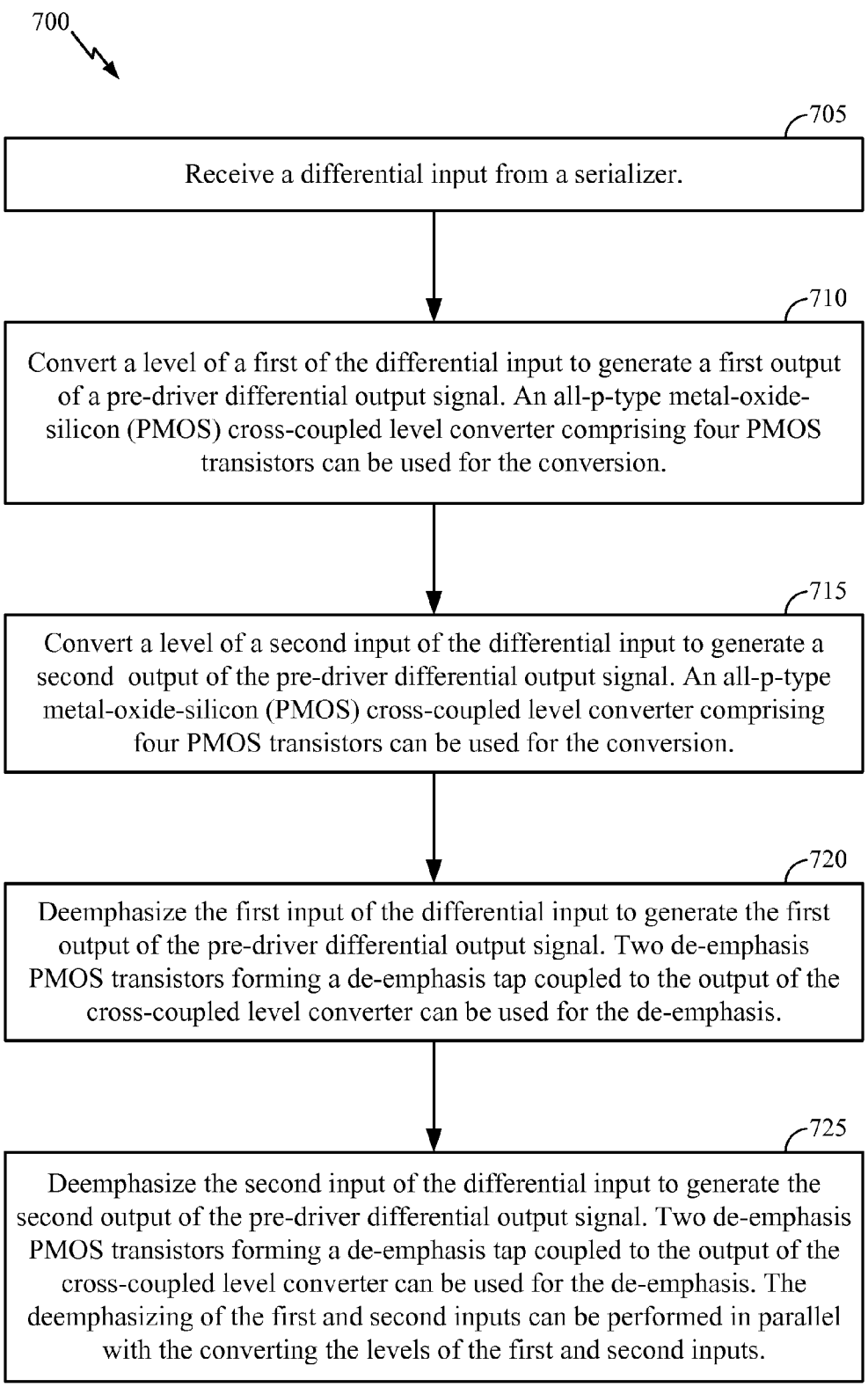
FIG. 7 depicts a flowchart of an exemplary method for pre-driving, voltage converting, and de-emphasizing an HDMI signal.

FIG. 7 depicts an exemplary method 700 for pre-driving, voltage converting, and de-emphasizing an HDMI signal. The method 700 for pre-driving, voltage converting, and de-emphasizing an HDMI signal can be performed by the apparatus described hereby, such as the transmitter 205.

In step 705, a differential input is received from a serializer.

In step 710, a level of a first input of the differential input is converted to generate a first output of a pre-driver differential output signal. An all-p-type metal-oxide-silicon (PMOS) cross-coupled level converter comprising four PMOS transistors can be used for the conversion.

In step 715, a level of a second input of the differential input is converted to generate a second output of the pre-driver differential output signal. An all-p-type metal-oxide-silicon (PMOS) cross-coupled level converter comprising four PMOS transistors can be used for the conversion.

In step 720, the first input of the differential input is de-emphasized to generate the first output of the pre-driver differential output signal. Two de-emphasis PMOS transistors forming a de-emphasis tap coupled to the output of the cross-coupled level converter can be used for the de-emphasis.

In step 725, the second input of the differential input is de-emphasized to generate the second output of the pre-driver differential output signal. Two de-emphasis PMOS transistors forming a de-emphasis tap coupled to the output of the cross-coupled level converter can be used for the de-emphasis. The deemphasizing of the first and second inputs can be performed in parallel with the converting the levels of the first and second inputs.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

In some aspects, the teachings herein can be employed in a multiple-access system capable of supporting communication with multiple users by sharing the available system resources (e.g., by specifying one or more of bandwidth, transmit power, coding, interleaving, and so on). For example, the teachings herein can be applied to any one or combinations of the following technologies: Code Division Multiple Access (CDMA) systems, Multiple-Carrier CDMA (MCCDMA), Wideband CDMA (W-CDMA), High-Speed Packet Access (HSPA, HSPA+) systems, Time Division Multiple Access (TDMA) systems, Frequency Division Multiple Access (FDMA) systems, Single-Carrier FDMA (SC-FDMA) systems, Orthogonal Frequency Division Multiple Access (OFDMA) systems, or other multiple access techniques. A wireless communication system employing the teachings herein can be designed to implement one or more standards, such as IS-95, cdma2000, IS-856, W-CDMA, TDSCDMA, and other standards. A CDMA network can implement a radio technology such as Universal Terrestrial Radio Access (UTRA), cdma2000, or some other technology. UTRA includes W-CDMA and Low Chip Rate (LCR). The cdma2000 technology covers IS-2000, IS-95 and IS-856 standards. A TDMA network can implement a radio technology such as Global System for Mobile Communications (GSM). An OFDMA network can implement a radio technology such as Evolved UTRA (E-UTRA), IEEE 802.11, IEEE 802.16, IEEE 802.20, Flash-OFDM™, etc. UTRA, E-UTRA, and GSM are part of Universal Mobile Telecommunication System (UMTS). The teachings herein can be implemented in a 3GPP Long Term Evolution (LTE) system, an Ultra-Mobile Broadband (UMB) system, and other types of systems. LTE is a release of UMTS that uses E-UTRA. UTRA, E-UTRA, GSM, UMTS and LTE are described in documents from an organization named "3rd Generation Partnership Project" (3GPP), while cdma2000 is described in documents from an organization named "3rd Generation Partnership Project 2" (3GPP2). Although certain aspects of the disclosure can be described using 3GPP terminology, it is to be understood that the teachings herein can be applied to 3GPP (e.g., Rel99, Rel5, Rel6, Rel7) technology, as well as 3GPP2 (e.g., 1×RTT, 1×EV-DO RelO, RevA, RevB) technology and other technologies. The techniques can be used in emerging and future networks and interfaces, including Long Term Evolution (LTE).

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

An embodiment of the invention can include a computer readable media embodying a method described herein. Accordingly, the invention is not limited to illustrated examples and any means for performing the functionality described herein are included in embodiments of the invention.

The disclosed devices and methods can be designed and configured into GDSII and GERBER computer files that are stored on a computer readable media. These files are in turn provided to fabrication handlers who fabricate devices, based on these files, with a lithographic device. The resulting products are semiconductor wafers that are then cut into semiconductor dice, which are packaged into a respective semiconductor chip. The chip is then employed in a device, such as a mobile device.

Nothing that has been stated or illustrated is intended to cause a dedication of any component, step, feature, object, benefit, advantage, or equivalent to the public, regardless of whether it is recited in the claims. While this disclosure describes exemplary embodiments of the invention, it should be noted that various changes and modifications could be made herein without departing from the scope of the invention as defined by the appended claims.

What is claimed is:

1. An integrated circuit, comprising:
   a serializer;
   a pre-driver coupled to receive a differential input from the serializer, wherein the pre-driver comprises:
   an all-p-type metal-oxide-silicon (PMOS) cross-coupled level converter comprising four PMOS transistors; and two de-emphasis PMOS transistors forming a de-emphasis tap coupled to the output of the cross-coupled level converter; and a driver coupled to the pre-driver output and configured to receive a differential input from the pre-driver.

2. The integrated circuit of claim 1, wherein each input of the differential input from the serializer is coupled to a respective complementary input of the cross-coupled level converter.

3. The integrated circuit of claim 1, wherein each input of the differential input from the serializer is coupled to an input of a respective one of the de-emphasis PMOS transistors.

4. The integrated circuit of claim 1, further comprising:
a tail current control transistor coupled between the cross-coupled level converter and ground; and
a current mirror coupled to control the tail current control transistor.

5. The integrated circuit of claim 4, further comprising a second current mirror coupled to be controlled by the first current mirror and to supply current to the two de-emphasis PMOS transistors.

6. The integrated circuit of claim 1, wherein the serializer is powered by a first power domain and the cross-coupled level converter is powered by a second power domain.

7. The integrated circuit of claim 1, wherein the integrated circuit is integrated with at least one of an HDMI v1.4-compatible device, a mobile device, a set-top box, a television, a computer, a computer video card, a game console, DVD player, a satellite receiver, a monitor, a display headset, a video repeater, a video camera, a home theatre receiver, and a video switching device.

8. The integrated circuit of claim 1, wherein at least one of the serializer, the pre-driver, and the driver are integrated on at least one semiconductor die.

9. A method, comprising:
receiving a differential input from a serializer;
converting a level of a first input of the differential input to generate a first output of a pre-driver differential output signal;
converting a level of a second input of the differential input to generate a second output of the pre-driver differential output signal;
deemphasizing the first input of the differential input to generate the first output of the pre-driver differential output signal; and
deemphasizing the second input of the differential input to generate the second output of the pre-driver differential output signal.

10. The method of claim 9, wherein the deemphasizing of the first and second inputs is performed in parallel with the converting the levels of the first and second inputs.

11. The method of claim 9, wherein the converting the levels of the first and second inputs comprises using an all-p-type metal-oxide-silicon (PMOS) cross-coupled level converter comprising four PMOS transistors.

12. The method of claim 11, wherein the deemphasizing of the first and second inputs further comprises using two de-emphasis PMOS transistors forming a de-emphasis tap coupled to the output of the cross-coupled level converter.

13. An apparatus configured to pre-drive a differential input from a serializer, comprising:
means for receiving the differential input;
means for converting a level of a first input of the differential input to generate a first output of a pre-driver differential output signal;
means for converting a level of a second input of the differential input to generate a second output of the pre-driver differential output signal;
means for deemphasizing the first input of the differential input to generate the first output of the pre-driver differential output signal; and
means for deemphasizing the second input of the differential input to generate the second output of the pre-driver differential output signal.

14. The apparatus of claim 13, further comprising means for deemphasizing the first and second inputs in parallel with the converting the levels of the first and second inputs.

15. The apparatus of claim 13, wherein the means for converting the levels of the first and second inputs comprises an all-p-type metal-oxide-silicon (PMOS) cross-coupled level converter comprising four PMOS transistors.

16. The apparatus of claim 15, wherein the means for deemphasizing the first and second inputs further comprises two de-emphasis PMOS transistors forming a de-emphasis tap coupled to the output of the cross-coupled level converter.

17. The apparatus of claim 13, wherein the apparatus is at least partially integrated on at least one semiconductor die.

18. A non-transitory computer-readable medium, comprising instructions stored thereon that, if executed by a lithographic device, cause the lithographic device to fabricate at least a part of an integrated circuit, comprising:
a serializer;
a pre-driver coupled to receive a differential input from the serializer, wherein the pre-driver comprises:
an all-p-type metal-oxide-silicon (PMOS) cross-coupled level converter comprising four PMOS transistors; and
two de-emphasis PMOS transistors forming a de-emphasis tap coupled to the output of the cross-coupled level converter; and
a driver coupled to the pre-driver output and configured to receive the differential input from the pre-driver.

19. The non-transitory computer-readable medium of claim 18, further comprising instructions stored thereon that, if executed by the lithographic device, cause the lithographic device to fabricate each output of a serializer differential output coupled to a respective complementary input of the cross-coupled level converter.

20. The non-transitory computer-readable medium of claim 18, further comprising instructions stored thereon that, if executed by the lithographic device, cause the lithographic device to fabricate each output of a serializer differential output coupled to an input of a respective one of the two de-emphasis PMOS transistors.

21. The non-transitory computer-readable medium of claim 18, further comprising instructions stored thereon that, if executed by the lithographic device, cause the lithographic device to fabricate a tail current control transistor coupled between the cross-coupled level converter and ground, and a current mirror coupled to control the tail current control transistor.

22. The non-transitory computer-readable medium of claim 18, further comprising instructions stored thereon that, if executed by the lithographic device, cause the lithographic device to fabricate the serializer powered by a first power domain and the cross-coupled level converter powered by a second power domain.

23. The non-transitory computer-readable medium of claim 18, further comprising instructions stored thereon that, if executed by the lithographic device, cause the lithographic device to fabricate at least one of the serializer, the pre-driver, and the driver are integrated on at least one semiconductor die.

24. A method, comprising:
   a step for receiving a differential input from a serializer;
   a step for converting a level of a first input of the differential input to generate a first output of a pre-driver differential output signal;
   a step for converting a level of a second input of the differential input to generate a second output of the pre-driver differential output signal;
   a step for deemphasizing the first input of the differential input to generate the first output of the pre-driver differential output signal; and
   a step for deemphasizing the second input of the differential input to generate the second output of the pre-driver differential output signal.

* * * * *